United States Patent [19]

Bender

[11] 4,117,410

[45] Sep. 26, 1978

[54] PHASE LOCKED LOOP SIGNAL DEMODULATOR AND SQUELCH CIRCUIT

[75] Inventor: Steven Frank Bender, Burnsville, Minn.

[73] Assignee: Motorola, Inc., Schaumburg, Ill.

[21] Appl. No.: 841,611

[22] Filed: Oct. 13, 1977

[51] Int. Cl.² .............................................. H03D 3/18
[52] U.S. Cl. ..................................... 329/50; 325/346; 325/348; 325/349; 329/122; 329/136; 331/8; 331/23; 331/27; 331/34; 331/108 D; 331/113 R
[58] Field of Search .................... 331/8, 18, 23, 25, 27, 331/34; 329/50, 103, 110, 122, 124, 125, 136; 325/346, 348, 349, 418–423

[56] References Cited

U.S. PATENT DOCUMENTS

| 3,397,360 | 8/1968 | Kaneko et al. | 325/348 X |
| 3,457,512 | 7/1969 | Deman | 325/348 X |
| 3,564,434 | 2/1971 | Camenzind et al. | 329/122 |
| 3,582,809 | 6/1971 | Rigby | 331/8 |
| 3,659,224 | 4/1972 | Ball | 331/111 |
| 3,896,272 | 7/1975 | Takahashi et al. | 179/15 BT X |

Primary Examiner—Siegfried H. Grimm
Attorney, Agent, or Firm—James W. Gillman; Rolland R. Hackbart

[57] ABSTRACT

An FM demodulator and detector suitable for integration including a phase locked loop for locking to an FM signal and recovering the modulating signal and squelch circuitry coupled to the phase locked loop for gating out the recovered modulating signal. The phase locked loop includes an emitter coupled multivibrator whose phase shifted output is applied together with the FM signal to the squelch circuitry for quadrature phase detection, followed by filtering to derive an indication signal for controlling the gating of the recovered modulating signal.

5 Claims, 8 Drawing Figures

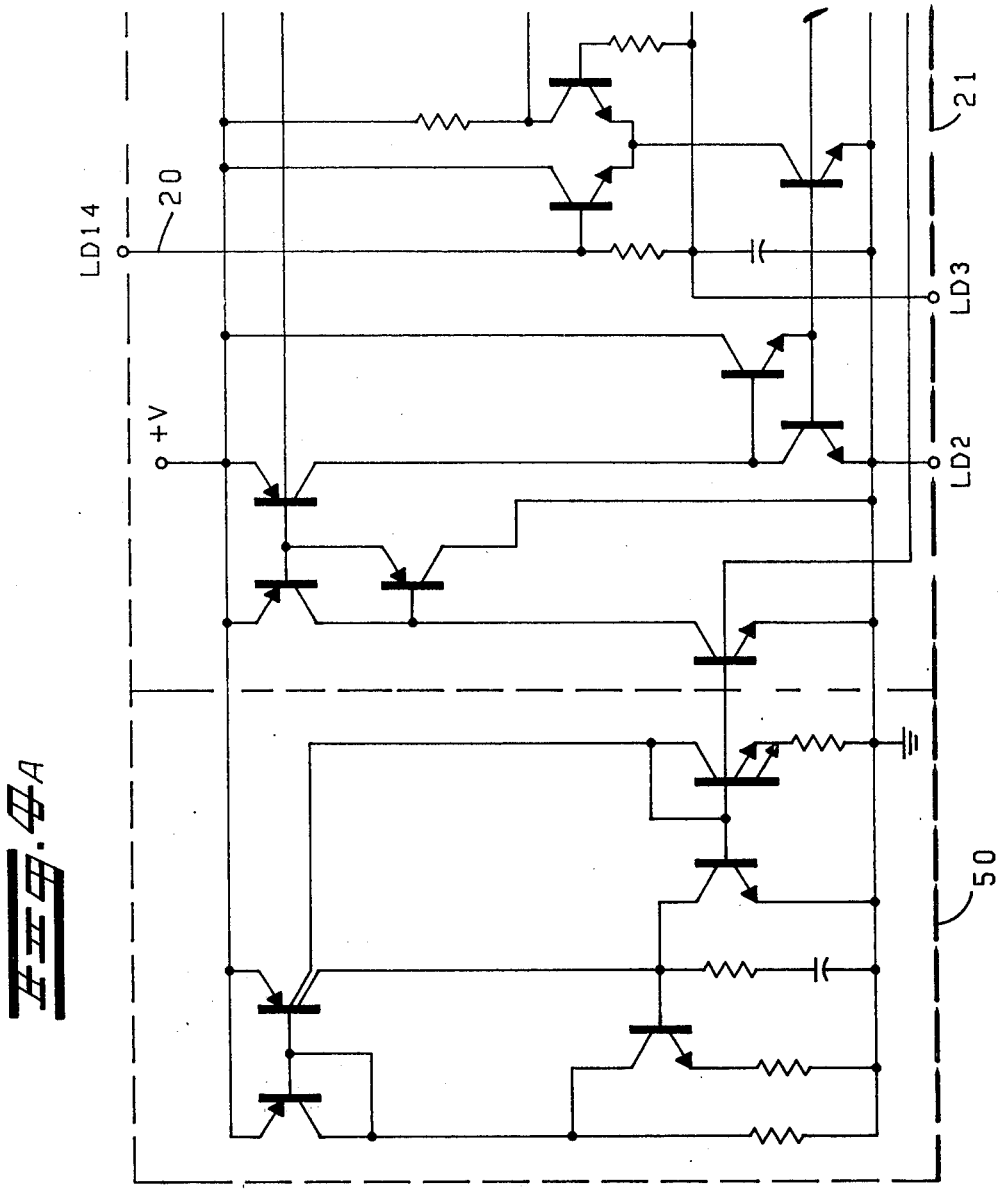
FIG. 4A
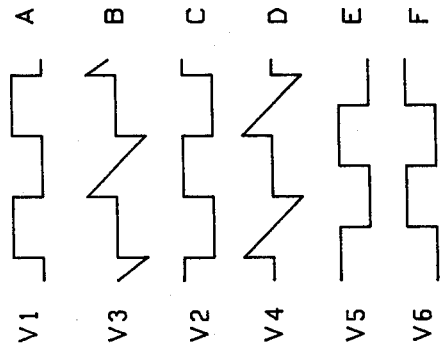
FIG. 4E
FIG. 4F

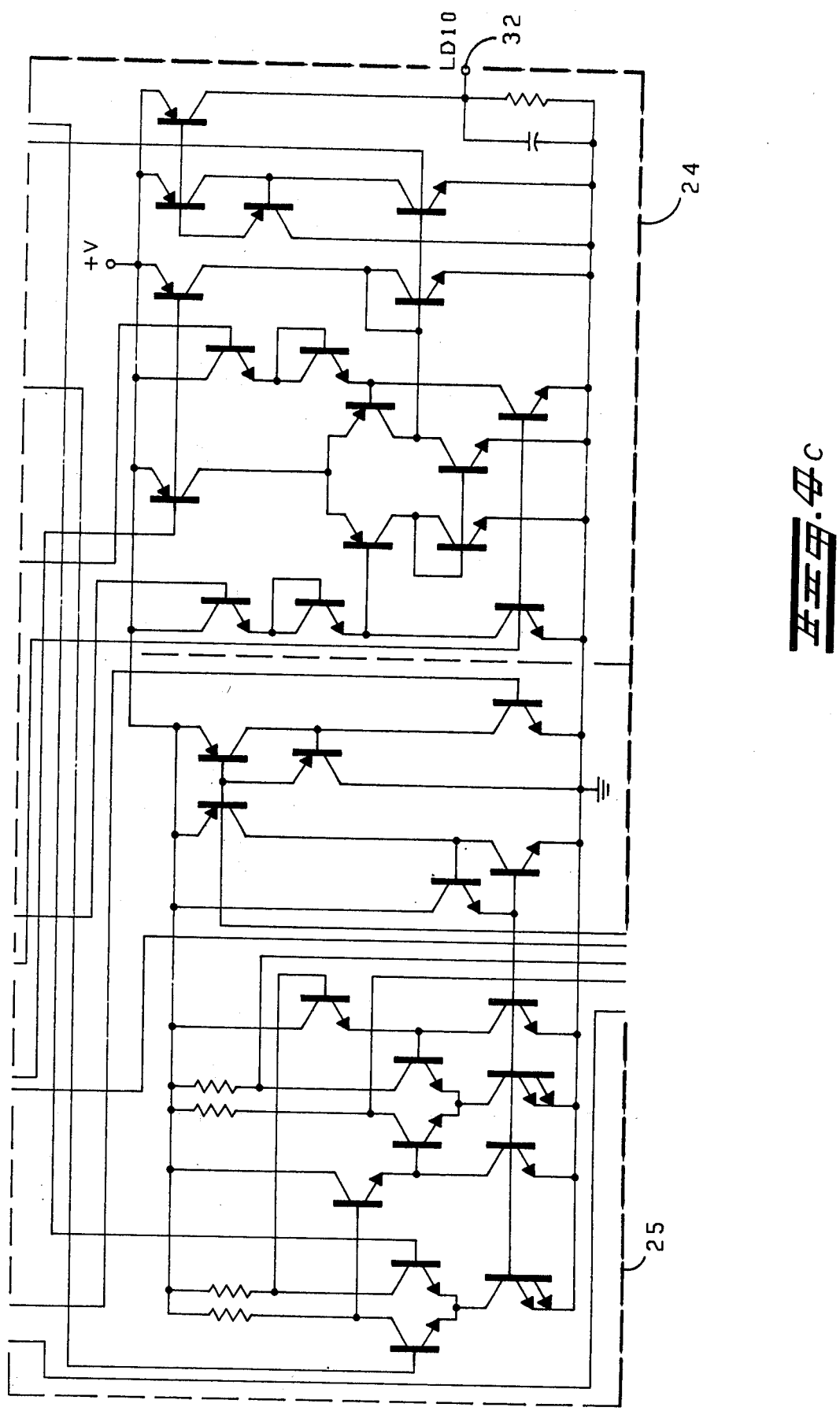

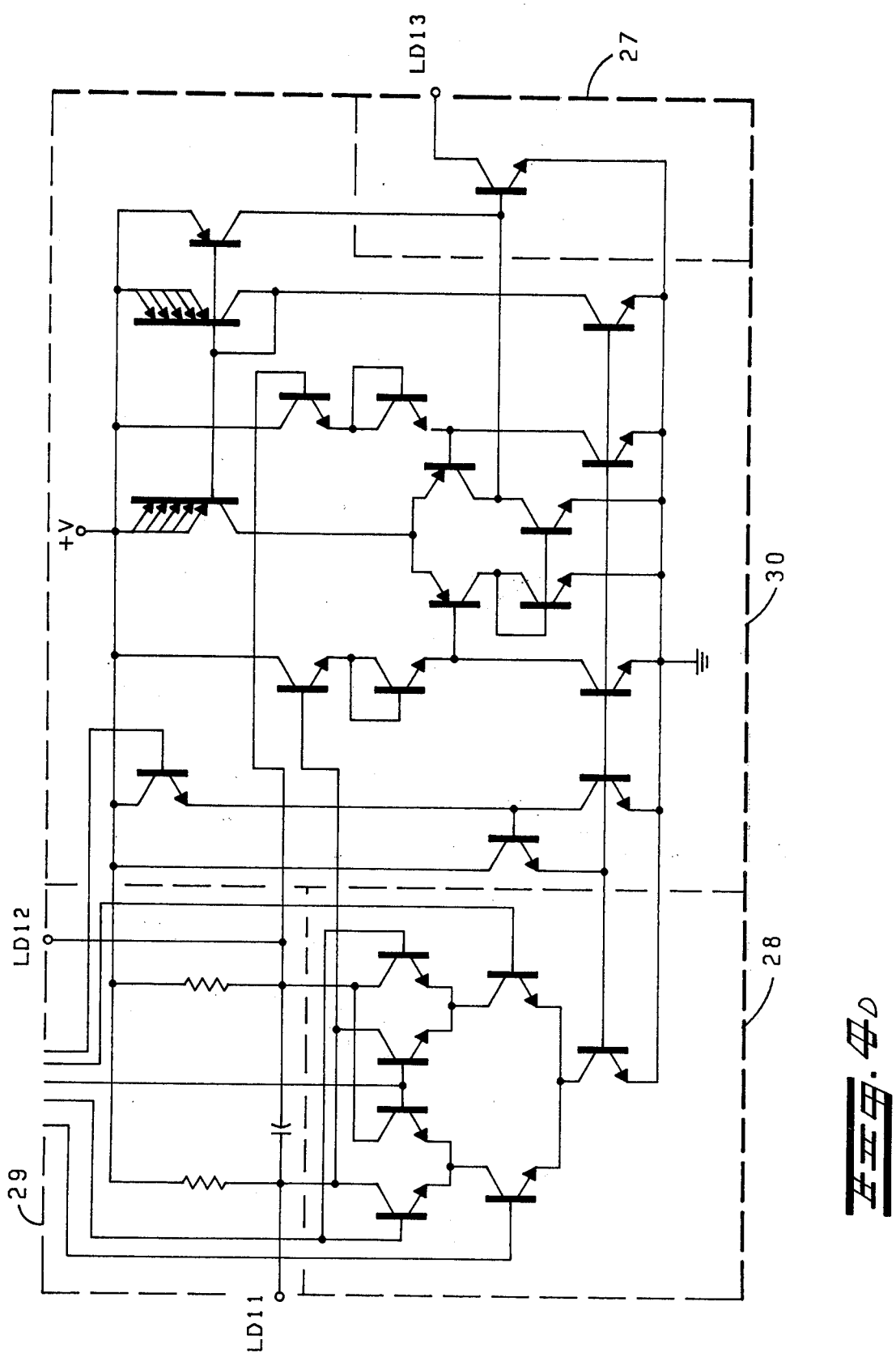

PHASE LOCKED LOOP SIGNAL DEMODULATOR AND SQUELCH CIRCUIT

BACKGROUND OF THE INVENTION

1. Field of the Invention

This invention relates to a signal demodulator and detector, and more particularly, to an improved FM demodulator and detector.

2. Description of the Prior Art

In the prior art, frequency selective circuits including phase locked loops have been utilized as signal demodulators for recovering the modulating signal of an FM signal. Phase locked loops per se are known in the art as, for example, basically described in the book entitled "Phase Locked Techniques" by Floyd M. Gardner, published by John Wiley & Sons, 1966. Such a phase locked loop has been utilized in discrete systems applications such as aerospace telemetry, and, more recently, has been incorporated into integrated circuits for use in tone detectors, as shown in U.S. Pat. No. 3,659,224, entitled "Temperature Stable Integrated Oscillator," by J. V. Ball and in FM demodulators, as shown in U.S. Pat. No. 3,564,434, entitled "Integrated Frequency Selective Circuit and Demodulator Including Phase Locked Loop," by H. R. Camenzind et al. However, for FM radio systems it is necessary to have both an FM signal demodulator and a reliable FM signal detector which squelches the recovered modulating signal when the FM signal is not present. Such as FM signal demodulator and detector that is provided on an integrated circuit and that operates at relatively low DC supply voltages with relatively low current drain is particularly well adapted for portable FM radio applications where discrete systems would be impractical and prohibitively expensive.

For the foregoing and other shortcomings and problems, there has been a long felt need for an improved FM signal demodulator and detector.

SUMMARY OF THE INVENTION

Accordingly, it is a general object of the present invention to provide an improved FM signal demodulator and detector.

It is a further object of the present invention to provide an improved FM signal demodulator and detector that utilizes no inductors and is readily integrated into a semiconductive substrate.

It is a still further object of the present invention to provide an improved FM signal demodulator and detector that detects the absence of the FM signal and squelches the recovered modulating signal.

In accordance with the present invention, the aforementioned problems and shortcomings of the prior art are overcome and the stated and other objects are attained by an improved FM signal demodulator and detector that includes a phase locked loop for locking to the FM signal and recovering the modulating signal, output signal utilization circuitry circuitry for detecting a predetermined magnitude of the FM signal and providing an indication and switching circuitry for gating the recovered modulating signal to the output signal utilization circuitry in response to the indication from said detecting circuitry. Otherwise, the modulating signal is squelched, not being gated to the output signal utilization circuitry. Such as FM signal demodulator and detector is advantageously adapted to be utilized in the receiver portion of an FM radio.

The phase locked loop, including a phase comparator, a low pass filter and a DC amplifier connected in series in a forward path and a current controlled oscillator (CCO) connected between the DC amplifier and the phase comparator in a feedback path, is tuned to the carried frequency of the FM signal. The CCO output signal is phase shifted by 90 degrees and applied together with the FM signal to a quadrature phase comparator. The output of the quadrature phase comparator is applied to filter circuitry for filtering out substantially all frequencies and passing the DC component to provide a DC indication signal. Amplifier circuitry provides a predetermined amplification to the filtered DC indication signal which is then applied to switching circuitry. The switching circuitry gates the recovered modulating signal to the output signal utilization circuitry when the magnitude of the amplified DC indication signal is greater than a predetermined magnitude. Otherwise, the recovered modulating signal is squelched by the switching circuitry.

According to another feature of the present invention, the CCO is an emitter coupled multivibrator having a timing capacitor and the 90° phase shift is provided by a differential comparator coupled to the timing capacitor. The differential comparator can be implemented in a semiconductive substrate without using inductive or capacitive elements.

BRIEF DESCRIPTION OF THE DRAWINGS

FIG. 3 shows the waveforms taken at the various points in the circuit of FIG. 2.

FIGS. 4A, 4B, 4C and 4D when arranged in accordance with FIG. 4E show a circuit diagram of an FM signal demodulator and detector of the present invention which is suitable for integration into a semiconductive substrate.

DESCRIPTION OF THE PREFERRED EMBODIMENT

Figure 1:
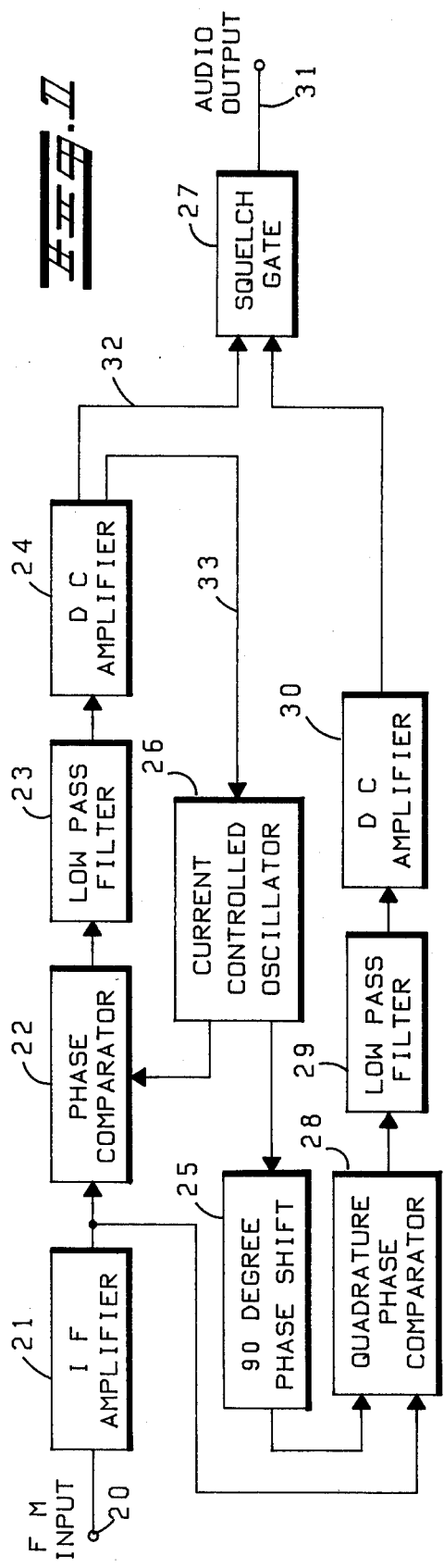
FIG. 1 shows a block diagram of am FM signal demodulator and detector in accordance with the present invention.

Referring to FIG. 1, a block diagram of a FM demodulator and detector in accordance with the present invention is shown which includes a phase locked loop, a signal detector for providing an indication of a predetermined magnitude of the FM signal 20 and gating circuitry responsive to the indication for gating out the recovered modulating signal. The phase locked loop is adapted to operate at the carrier frequency of the FM signal 20, and for radio applications, may be alternatively operated at an intermediate frequency (IF).

In FIG. 1, the FM signal 20 is applied to IF amplifier 21 which amplifies the signal and provides impedance matching to succeeding blocks. The outut of the IF amplifier 21 is differentially applied to the phase locked loop, blocks 22, 23, 24, and 26, and to the quadrature phase comparator 28. Differential coupling is also used between blocks 22, 23, and 24, blocks 26 and 22, and blocks 26, 25, 28, 29, and 30. The phase locked loop includes phase comparator 22, low pass filter 23, DC amplifier 24 and current controlled oscillator (CCO) 26. The phase comparator 22 compares the phase of the amplified FM signal with the phase of the CCO output signal and provides an output signal to the low pass filter 23, which is a measure of the phase difference between the amplified FM signal and the CCO output signal. The output signal of the phase comparator 22, which operates as a multiplier, is composed of several sum and difference frequency components. When the phase locked loop is locked, the output signal of the phase comparator 22 includes a DC component which is proportional to the phase difference between the amplified FM signal and the CCO output signal and thus follows the modulating signal.

The low pass filter 23 filters out the high frequency components of the output signal from the phase comparator 22 and passes the DC component to the DC amplifier 24. The low pass filter 23 is selected to have sufficient bandwith to pass the frequency range of the modulating signal carried by the DC component. The filtered DC component from the low pass filter 23 is amplified by the DC amplifier 24 to provide the recovered modulating signal 32 to the squelch gate 27 and a DC control current 33 to the CCO for controlling its operating frequency.

The CCO output signal is then phase shifted by the 90 degree phase shift 25 and applied to the quadrature phase comparator 28 together with the amplified FM signal. When the loop is locked, the quadrature phase comparator provides an output signal which has a DC component that is proportional to the signal strength of the FM signal 20. High frequency components of the output signal from the quadrature phase comparator 28 are filtered out by low pass filter 29 which passes the DC component to DC amplifier 30. When the FM signal 20 is absent, the loop is out of lock, and the DC component of the output signal from the quadrature phase comparator 28 is almost zero. The DC amplifier 30 opens the squelch gate 27 which couples the recovered modulating signal 32 to the audio output 31 when the filtered DC component is greater than a predetermined magnitude. Otherwise, the squelch gate 27 squelches the recovered modulating signal. The squelch condition is produced for weak FM signals 20 corresponding to filtered DC components which are less than the predetermined magnitude.

Figure 2:
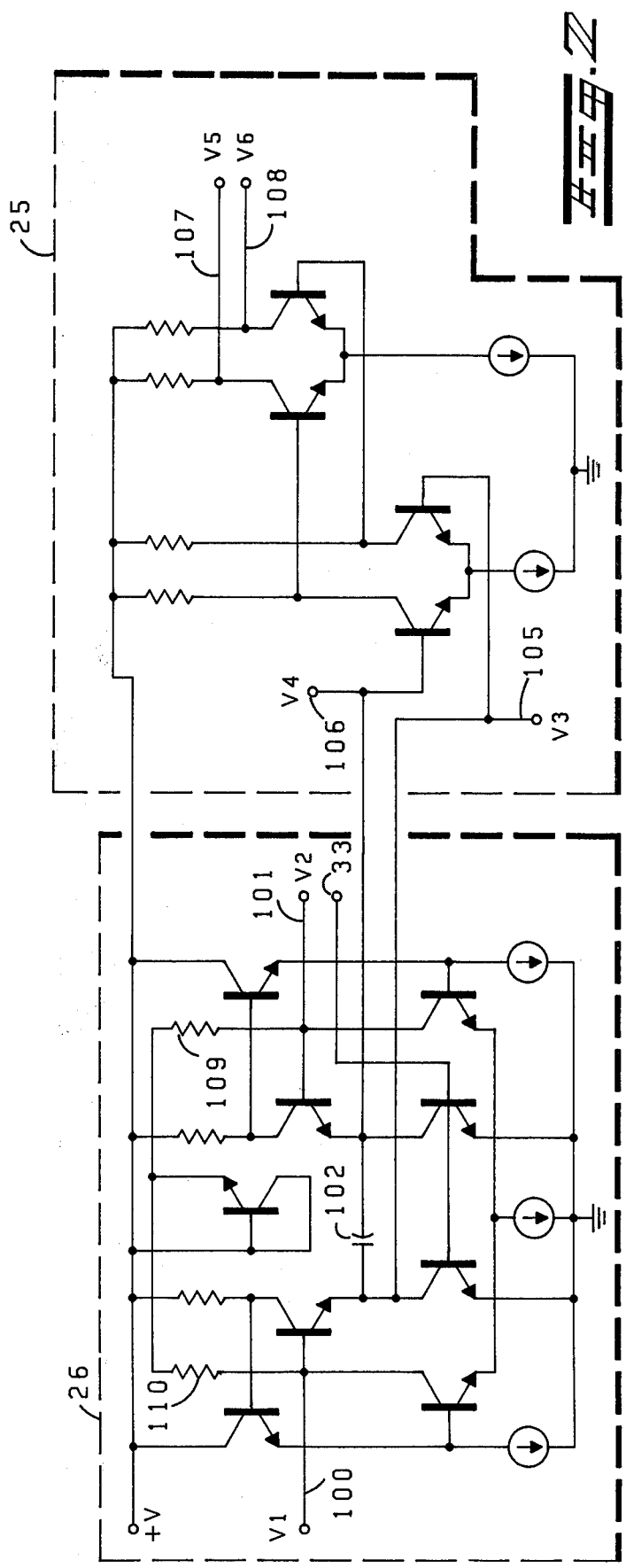
FIG. 2 shows an emitter coupled multivibrator circuit and a phase shift circuit for phase shifting the output of the multivibrator by 90°.

In the preferred embodiment of the present invention, the CCO 26 is an emitter coupled multivibrator. Emitter coupled multivibrators are basically described in the book, "Pulse, Digital and Switching Waveforms," by J. Millman and H. Taub, published by McGraw-Hill, 1965, on pages 445-451. A current controlled multivibrator 26 is shown in FIG. 2 together with a 90 degree phase shift 25. The operation of an emitter coupled multivibrator is also described in U.S. Pat. No. 3,582,809, entitled "Phase Locked Loop with Voltage Control Oscillator," by G. A. Rigby.

The free running frequency of the current controlled multivibrator 26 is tuned to be substantially the same frequency as the FM signal by appropriately selecting the values of the capacitor 102 and resistors 109 and 110. The free running frequency of the emitter coupled multivibrator 26 can be varied over a predetermined range by the control current 33 in order to lock to the FM signal.

Waveforms of the differential outputs 100 and 101 of the emitter coupled multivibrator 26 are shown in FIGS. 3A and 3C. The corresponding voltage waveforms 105 and 106 across the capacitor 102 are shown in FIGS. 3B and 3D and are differentially applied to the differential comparator 25. The operation of a differential comparator 25 or amplifier is basically described in the book, "Pulse, Digital and Switching Waveforms," by J. Millman and H. Taub, published by McGraw-Hill, 1965, on pages 256-259. The outputs 107 and 108 of the differential comparator 25 are proportional to the difference between the capacitor voltages 105 and 106 which have the same DC offset voltage. When the capacitor voltage 106 is greater than the capacitor voltage 105, the output voltage 107 of the differential comparator 25 is at a higher voltage than output voltage 108, and vice versa. The differential comparator 25 senses the difference between the capacitor voltages 105 and 106 to produce output voltages 107 and 108 which are shifted by 90 degrees from the output voltages 100 and 101 of the emitter coupled multivibrator 26, respectively. Thus, the 90 degree phase shifting of the output voltages 100 and 101 of the emitter coupled multivibrator 26 has been accomplished without the use of capacitor and inductive circuit elements and can be readily formed in a semiconductive substrate.

Figure 4B:
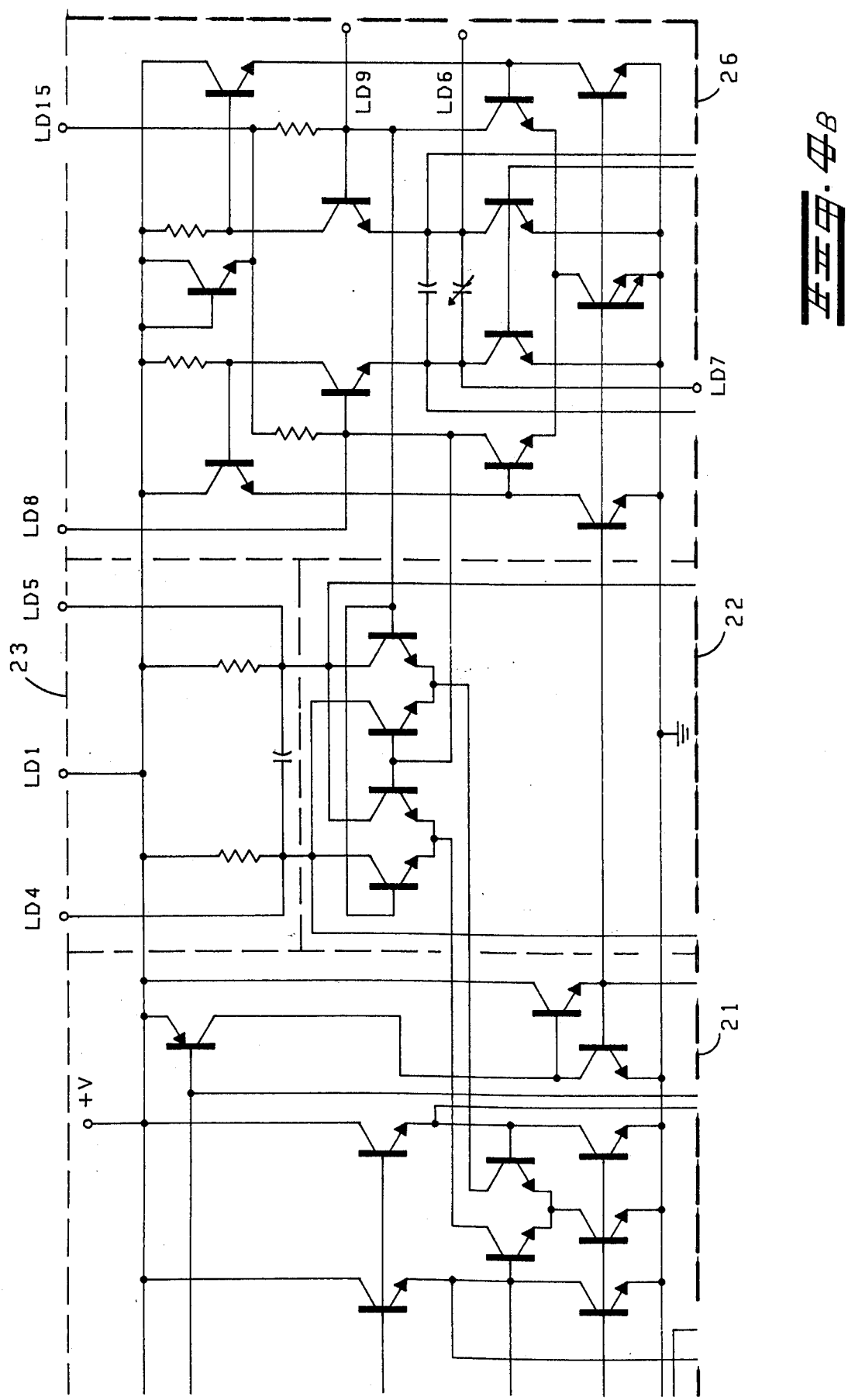

Referring to FIGS. 4A, 4B, 4C and 4D when arranged as in FIG. 4E, a circuit diagram in accordance with the block diagram of FIG. 1 illustrates an integrated circuit embodiment of the present invention. The circuit elements corresponding to the blocks of FIG. 1 are identified by the same number and enclosed by dashed lines. To implement the block diagram as shown in FIG. 1 in an integrated circuit, a current source 50 is required that provides a constant current to the various circuit blocks through appropriate buffering stages. The integrated circuit is configured to have fifteen leads for external connections, the leads being indicated by LD1 through LD15. By choosing the leads so that some of the capacitors and resistors can be provided externally, the integrated circuit can be readily adapted for use in a wide variety of applications by appropriately selecting the external electrical components.

The integrated circuit described hereinabove can be made by well known prior art techniques utilizing either the diffused or dielectric type of isolation. Suitable integrated circuit techniques are described in the previously referenced U.S. Pat. Nos. 3,582,809 by Rigby; 3,659,224 by Ball; and with more detail, 3,564,434 by Camenzind et al. By utilizing diffused and pinched resistors, junction capacitors, and diffused bipolar transistors and providing components connected to leads externally, the integrated circuit can be formed on a semiconductive substrate which is approximately 70 mils by 70 mils.

A single-ended FM signal 20 is applied to LD14. The output signal LD13 from the squelch gate 27 can be connected directly to LD10 the recovered modulating signal 32 and, when detecting the absence of the FM signal, applies a ground to LD10 for squelching the recovered modulating signal 32. Alternatively, an audio amplifier can be coupled to LD10 after which the squelch gate 27 can be applied to audio gating circuitry, utilizing, for example, a field effect transistor switch, for squelching the output of the audio amplifier.

The integrated circuit described hereinabove is well adapted to operate at relatively low DC supply voltages and for a +V of 2.5 volts consumes less than 5.0 milliamps. Also, the integrated circuit is adapted to operate in the preferred frequency range of 300 to 500 kHz, although any practical frequency of operation can be utilized to accommodate a particular application. The integrated circuit of the present invention with the foregoing characteristics can be advantageously utilized in a battery-operated portable FM radio.

The features of the signal demodulator and detector of the present invention need not be limited to FM systems, but can be more broadly applied to other modulation systems. For example, the differential comparator for providing a 90° phase shift can be advantageously utlized with any emitter coupled multivibrator. In addition, the signal demodulator and detector of the present invention can also be used for tone detection in tone signalling systems.

The foregoing embodiments have been intended as illustrations of the principles of the present invention. Accordingly, other modifications, uses and embodiments can be devised by those skilled in the art without departing from the spirit and scope of the principles of the present invention.

What is claimed is:

1. In a demodulator for receiving a frequency modulated (FM) signal having a modulating signal with a predetermined range of frequencies, said demodulator including a phase locked loop having a phase comparator, a low pass filter and a DC amplifier connected in series in a forward path and a current controlled oscillator (CCO) connected between the DC amplifier and the phase comparator in a feedback path, said phase locked loop for locking to the FM signal and recovering the modulating signal, said demodulator including improvement comprising:

said CCO being configured as an emitter-coupled multivibrator having timing capacitor means and providing a first output signal;

output signal utilization means;

differential comparator means differentially coupled to the timing capacitor means of the CCO for providing a second output signal phase shifted by 90° from the first output signal of the CCO;

signal detecting means including a quadrature phase comparator, filter means, and amplifier means connected in series, the quadrature phase comparator multiplying the FM signal and the second output signal from the differential comparator means and providing a third output signal, the filter means filtering out substantially all frequencies from, and passing the DC component of, the third output signal of the quadrature phase comparator to provide a DC indication signal, the amplifier means providing a predetermined amplification to the DC indication signal; and switching means coupled to the amplifier means for gating the recovered modulating signal from the phase locked loop to said output signal utilization means when the magnitude of the amplified DC indication signal is greater than a predetermined magnitude.

2. The demodulator according to claim 1, wherein the filter means is of the low pass type.

3. The demodulator according to claim 1, for use with a voltage source providing a DC supply voltage, said demodulator further including a current source coupled to the voltage source for providing a DC current supply for said demodulator and a semiconductive substrate; said demodulator and current source being formed of noninductive electrical circuit elements integrated into the semiconductor substrate.

4. The demodulator according to claim 3, wherein the differential comparator means are formed of noninductive and noncapacitive electrical circuit elements.

5. In a detector for a tone signal having a predetermined frequency range, said detector including a phase locked loop having a phase comparator, a low pass filter and a first DC amplifier connected in series in a forward path and a current controlled oscillator (CCO) connected between the first DC amplifier and the phase comparator in a feedback path, said phase locked loop locking to the tone signal, the CCO being configured as an emitter coupled multivibrator having timing capacitor means and providing a first output signal, said detector including improvement comprising:

differential comparator means differentially coupled to the capacitor means of the CCO for providing a second output signal phase shifted by 90 degrees from the first output signal of the CCO;

tone signal detecting means including a guadrature phase comparator, a low pass filter, and a second DC amplifier connected in series, the quadrature phase comparator multiplying the tone signal and the second output signal from said differential comparator means and providing a third output signal, the low pass filter filtering out substantially all frequencies from, and passing the DC component of, the third output signal of the quadrature phase comparator to provide a DC tone indication signal, the second DC amplifier providing a predetermined amplification to the DC tone indication signal; and output means coupled to the second DC amplifier for sending a fourth output signal when the magnitude of the amplified DC tone indication signal is greater than a predetermined magnitude.

* * * * *